United States Patent [19]

Impey

[11] Patent Number: 4,591,220

[45] Date of Patent: May 27, 1986

[54] INJECTION MOLDED MULTI-LAYER CIRCUIT BOARD AND METHOD OF MAKING SAME

[75] Inventor: John Impey, Apt. 3E, Cortland Bldg., 640 Mix Ave., Hamden, Conn. 06514

[73] Assignees: Rollin Mettler; John Mettler; John Impey, all of North Haven, Conn.

[21] Appl. No.: 771,134

[22] Filed: Aug. 28, 1985

Related U.S. Application Data

[63] Continuation-in-part of Ser. No. 660,495, Oct. 12, 1984, abandoned.

[51] Int. Cl.⁴ .............................................. H05K 1/14
[52] U.S. Cl. .................................. 339/17 M; 29/830; 29/848; 361/414
[58] Field of Search ................ 339/17 R, 17 E, 17 M, 339/17 LM, 17 N, DIG. 3; 29/830, 831, 842, 843, 845, 846, 848; 361/413, 414

[56] References Cited

U.S. PATENT DOCUMENTS

| | | | |
|---|---|---|---|
| 3,028,573 | 4/1962 | Stoehr | 361/414 |
| 3,201,851 | 8/1965 | Stearns | 29/853 |
| 3,276,106 | 10/1966 | Bester et al. | 29/852 |
| 3,322,881 | 8/1964 | Schneble, Jr. et al. | 174/68.5 |
| 3,350,250 | 10/1967 | Sanz et al. | 361/414 |
| 3,465,435 | 9/1969 | Steranko | 29/843 |
| 3,680,209 | 8/1972 | Hacke | 29/831 |
| 3,880,486 | 4/1975 | Avakian | 339/DIG. 3 |
| 3,934,335 | 1/1976 | Nelson | 174/68.5 |
| 4,191,800 | 3/1980 | Holtzman | 428/251 |
| 4,357,647 | 11/1982 | Hadersbeck et al. | 361/400 |
| 4,402,135 | 9/1983 | Schweingruber et al. | 29/832 |

FOREIGN PATENT DOCUMENTS 834950  5/1981  U.S.S.R. ............................ 339/17 M

Primary Examiner—Neil Abrams
Attorney, Agent, or Firm—DeLio & Associates

[57] ABSTRACT

A multi-layer circuit board comprised of two or more circuit board substrates shaped by injection molding with mating interconnecting pins and holes and banded together with an electrically insulating adhesive material. Circuit leads are provided on both sides of each substrate recessed into channels formed in the surface of the substrate during the molding process. Electrical interconnection of the layers of circuitry occurs where the conductive materials of the circuit leads passes down through component lead holes axially located in the interconnecting pins and around the exterior of the interconnecting pins where contact is made with the conductive material coating on the interior of the interconnecting holes.

A method of making the multi-layer board includes injection molding the substrates in a suitable shaped mold, plating substantially all of the surface of the substrates with the conductive material, masking with a plating resist, plating again with conductive material, plating with an etch resistant contact material, removing the plating resist and flash-etching to remove the conductive material initially plated and masked by the plating resist so as to define the circuit leads. The preferred method uses a roller to apply the plating resist to some surfaces of the substrates.

21 Claims, 8 Drawing Figures

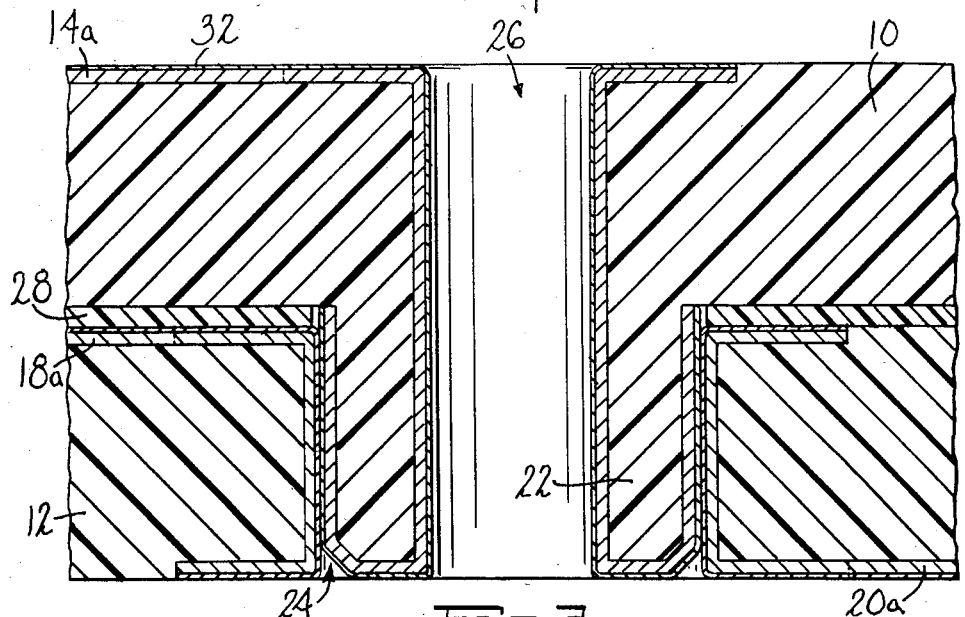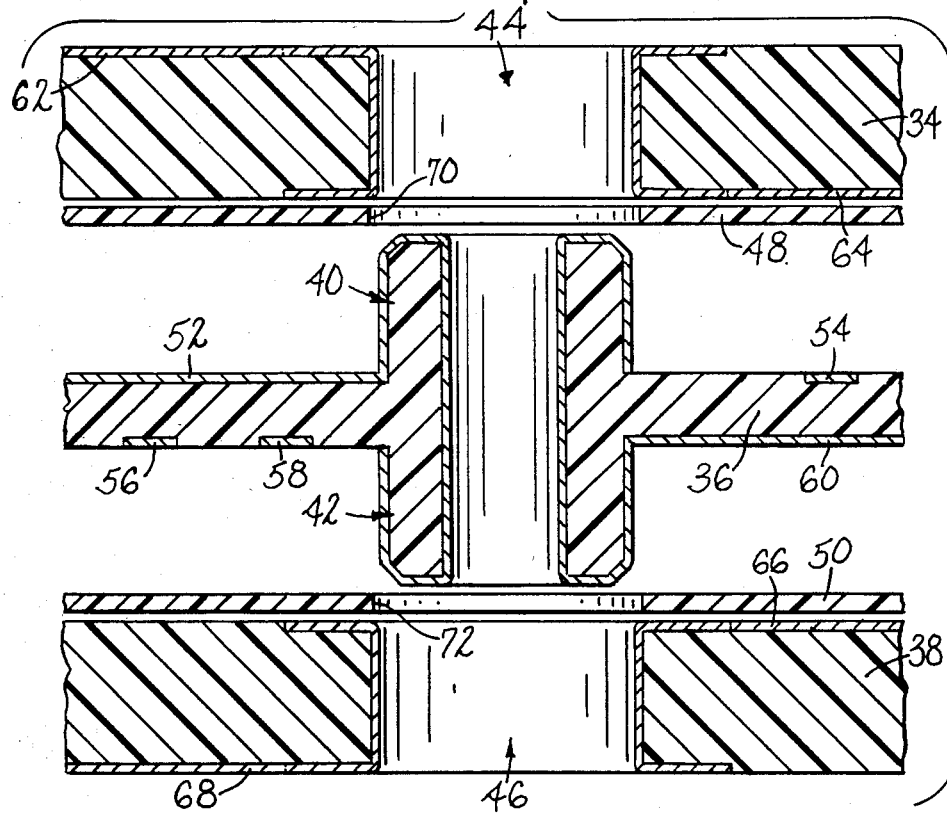

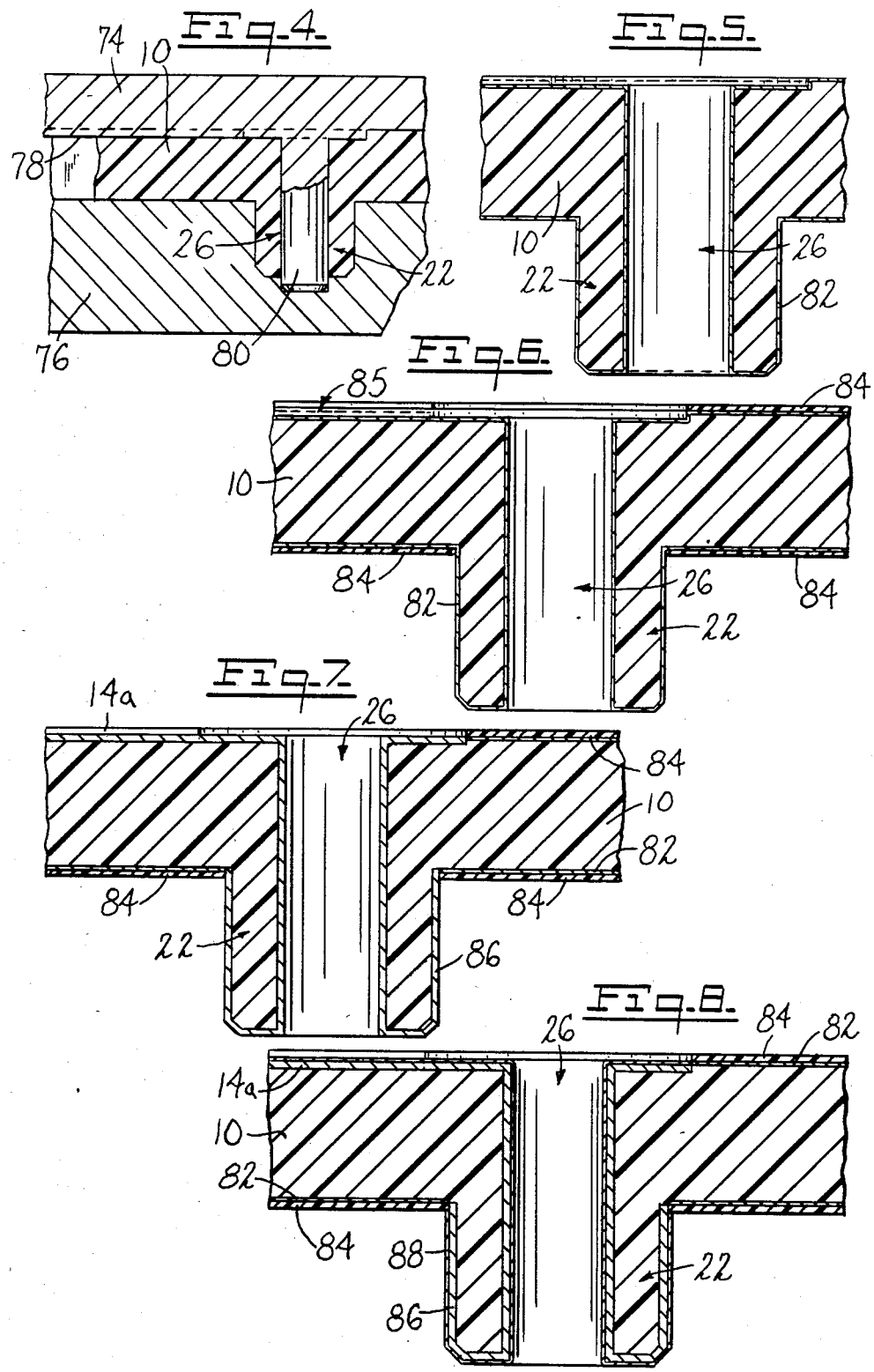

INJECTION MOLDED MULTI-LAYER CIRCUIT BOARD AND METHOD OF MAKING SAME

This application is a continuation-in-part of co-pending application Ser. No. 660,495, filed Oct. 12, 1984 now abandoned.

DESCRIPTION

1. Technical Field

This invention relates to multi-layer circuit boards and methods of making such boards. More particularly, it relates to multi-layer circuit boards having substrate layers which are three dimensionally shaped to mate together thereby providing accurate registration of the multiple layers and facilitating reliable electrical interconnection between the layers of circuitry.

2. Background Art

Modern electrical devices, particularly those such as computers employing large numbers of integrated circuits require circuit boards with multiple layers of circuitry to provide the many electrical interconnections required in such devices.

The multiple layers of electrical circuitry must be electrically connected at selected locations to produce the final circuit board. The most common problem in producing such multi-layer circuit boards has been in obtaining proper electrical interconnection between the circuit leads on one layer of the circuit board and the circuit leads on another layer.

A particular problem has been the difficulty in maintaining proper registration of the multiple layers of the circuit board.

The first multi-layer boards were made of two or more single or double sided circuit boards which were placed in proper registration and glued together. Holes were then drilled through the various layers, wires inserted into the holes and then soldered into place. Unfortunately, the many steps involved in manufacturing the individual circuit board layers, including heating, masking, etching and drilling, often caused warping or distortions in the shape of the board which made it impossible to obtain the proper registration required for assembly.

Other problems were encountered in making reliable electrical interconnection between the multiple layers of circuitry. The drilled holes with soldered wires often suffered from poor solder joints as well as misregistration. With varying degrees of success other techniques were tried which included using plated through holes and/or rivets to make the electrical interconnections.

Although other methods of obtaining the proper registration with good electrical interconnection have been tried, including multi-layer boards with metal interconnecting pins, none have been proven to be completely satisfactory in terms of reliability and cost.

DISCLOSURE OF INVENTION

The present invention is a multi-layer circuit board formed of at least two circuit board substrates, which have been shaped to mate with each other in a manner which allows the multi-layer board to be assembled only when the substrates are in perfect registration. A first substrate has interconnecting pins which project out of its surface and mate with matching interconnecting holes located in a second substrate. Additional layers of substrates may be added with corresponding interconnecting pins and holes.

Each layer of substrate may carry two layers of electrical circuitry on its upper and lower surfaces respectively. The circuitry is formed from any conductive material, usually copper, and although different techniques may be employed, the conductive material is preferably applied by plating.

On the substrate carrying the interconnecting pins, electrical interconnection between circuit leads on that substrate's upper and lower surfaces is accomplished by the conductive material which passes through the component lead holes axially located in the interconnecting pins. Similarly, on the substrate carrying the interconnecting holes, interconnection between the circuit leads on its upper and lower surface is accomplished by conductive material passing through the interconnecting holes.

Interconnection between layers of circuitry on different substrates is accomplished by the contact formed between conductive material on the outside of the interconnecting pins and the conductive material on the inside of the interconnecting holes.

In the preferred embodiment, the circuit leads are recessed into the surface of the substrate in circuit lead channels.

The conductive material may be coated with a contact material such as tin, gold or tin-lead.

The individual substrate layers with applied circuitry are bonded together with an electrically nonconductive adhesive material.

The method of making the multi-layer circuit board includes injection molding the substrates to form the interconnecting pins and holes as well as the component lead holes and, preferably, the recessed circuit lead channels. The electrically conductive material is then applied to defined portions of the substrate to form the circuit leads. It is also applied to the interior of the component lead holes, the interior of the interconnecting holes and the exterior of the interconnecting pins.

In the preferred method, the application of the conductive material is accomplished by electrolessly plating substantially all of the surface of the substrate with conductive material, masking with a plating resist leaving the areas where conductive material is to remain exposed and electrolytically plating to build up the thickness of the conductive material in the exposed areas.

The plating resist can then be removed and a quick flash-etch performed to remove unwanted conductive material. Alternately, an etch resist which serves as a contact material may be plated onto the electrolytic layer before the plating resist is removed.

The multi-layer board is then assembled as a sandwich with layers of electrically nonconductive adhesive material separating but bonding together the substrates carrying the layers of circuitry.

BRIEF DESCRIPTION OF DRAWINGS

The invention may be better understood by reference to the following detailed description when read in conjunction with the accompanying drawings, in which;

FIG. 2 is an enlarged cross-sectional view through an interconnecting pin showing the assembled four-layer board of FIG. 1.

FIG. 3 shows another embodiment of the invention in a six-layer circuit board showing an exploded cross-sectional view also taken through an interconnecting pin.

FIG. 4 is a cross-sectional view in slightly reduced scale from FIGS. 5-8 showing a circuit board substrate being produced inside an injection mold.

FIG. 5 is a cross-sectional view of the substrate and interconnecting pin seen in FIG. 4 in a subsequent step showing the electrolessly plated layer on the surface of the substrate.

FIG. 6 shows a step subsequent to that seen in FIG. 5 where a plating resist has been applied to selected areas of the surface of the substrate.

FIG. 7 shows a step subsequent to that seen in FIG. 6 wherein a layer of electrolytically deposited conductive material has been applied to the areas not covered by the plating resist.

FIG. 8 shows a step subsequent to that seen in FIG. 7 wherein an etch resistant contact material has been added to the surface of the elctrolytically deposited layer.

MODES FOR CARRYING OUT THE INVENTION

Figure 1:
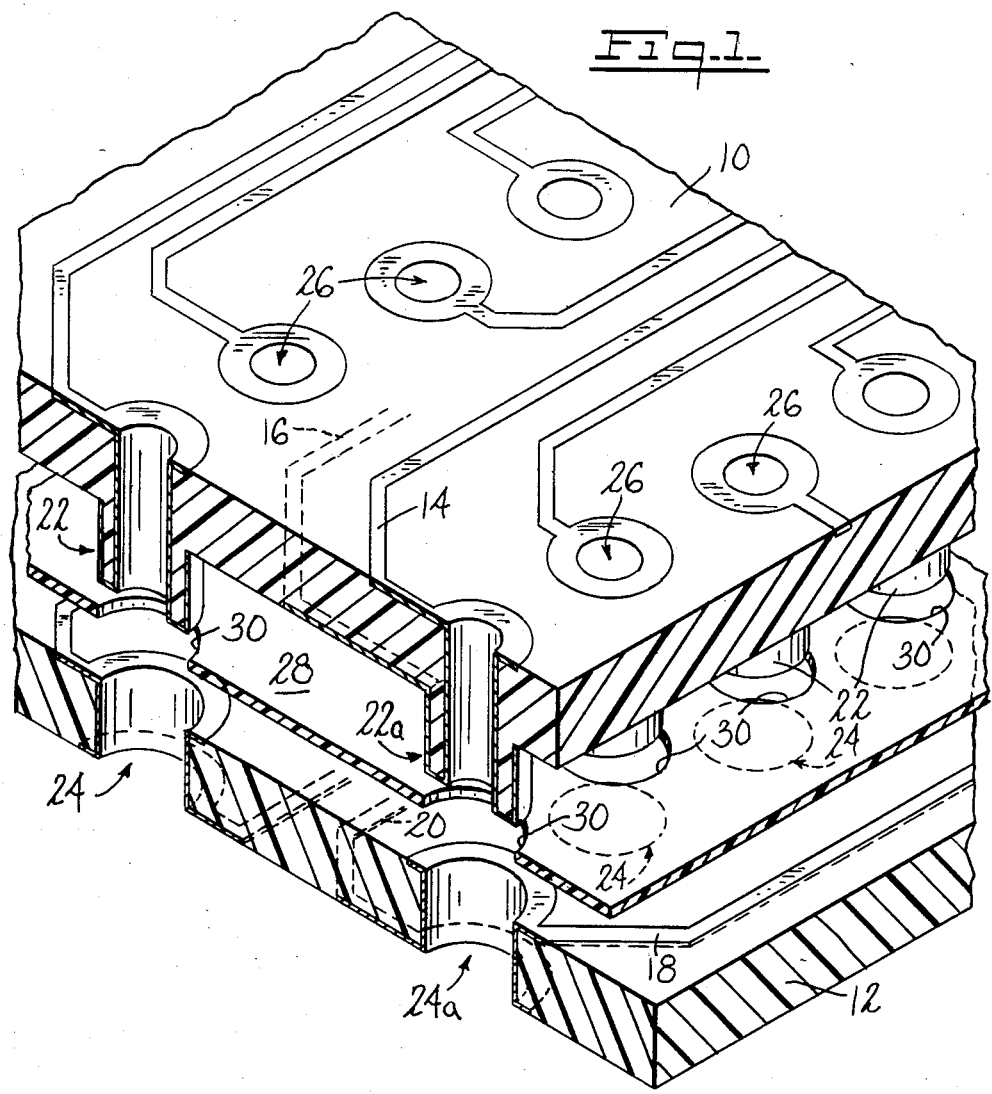
FIG. 1 is a perspective view of a portion of a four-layer circuit board in accordance with the present invention. The drawing is an exploded view for greater clarity.

Referring to FIG. 1, an exploded view of a portion of a four-layer circuit board is seen in accordance with the present invention. The circuit board is referred to as a "four-layer" circuit board because there are four layers of electrical circuitry although there are only two layers of substrates. Each of the two substrates (the first substrate 10 and the second substrate 12) has an upper surface and a lower surface containing circuit leads. For example, the first substrate 10 contains circuit leads 14 and 16 on its upper and lower surfaces respectively, while the second substrate 12 contains circuit leads 18 and 20 on its respective surfaces. While the drawing shows individual circuit leads on all surfaces, it should be understood, that in some applications it will be desirable to coat the upper surface of substrate 12 or the lower surface of substrate 10 with a large area of electrically conductive material (electrically isolated from the interconnecting pins 22 and the interconnecting holes 24) to provide shielding between the signals carried on the circuit leads of the first substrate 10 and the circuit leads of the second substrate 12.

As will be described in greater detail herein, the substrates are preferably manufactured by an injection molding process which provides all of the shaping of the substrates 10 and 12 during the initial formation of the substrate. This includes the formation of the interconnecting pins 22, the interconnecting holes 24, the component lead holes 26 which pass axially through the interconnecting pins 22, and the circuit lead channels which are recessed into the surface of the substrates 10, 12 to hold the circuit leads 14-18.

The substrates 10, 12 are preferably made of an electrically non-conductive plastic suitable for injection molding. Suitable plastics include polyethersulfone, polyetherimide and polysulfone, however numerous other suitable materials are well-known.

In the preferred embodiment, the first substrate 10 is bonded to the second substrate 12 by a sheet of electrically non-conductive adhesive material 28. A suitable adhesive material is known as "pre-preg" which is formed of a semi-cured thermosetting adhesive material in sheet form. Holes 30 are punched or drilled into the pre-preg to align with the interconnecting pins 22 on the first substrate 10. The entire multi-layer board is then assembled, and under heat and pressure, the pre-preg 28 is fully cured and bonds the upper substrate 10 to the lower substrate 12 forming the four-layer circuit board.

It can be seen that the conductive material (preferably copper) fills the circuit lead channels to form the circuit leads 14–20, and passes down through the component lead holes 26 in the interconnecting pins 22 and up around the exterior of each interconnecting pin 22. Similarly, the conductive material fills the circuit lead channels on the second substrate 12 and is plated into the interior of the interconnecting holes 24.

When the multi-layer circuit board is assembled, the conductive material on the exterior of the interconnecting pins 22 comes into intimate contact with the conductive material in the interior of the interconnecting holes 24. With appropriate circuit lead patterns, a connection can be made from any one of the four levels of circuitry to any other level. For example, circuit leads 14, 16, 18 and 20, each of which is located on a different layer, are all connected together through interconnecting pin 22a and interconnecting hole 24a.

Referring now to FIG. 2, a cross-sectional view of the assembled four-layer circuit board can be seen. Here, it can be seen that the circuit leads are located in circuit lead channels which are recessed into the surface of the substrates 10, 12.

This view shows that in the preferred embodiment the conductive material which makes up the circuit leads 14–20 and which coats the interconnecting pin 22 and holes 24 is itself coated with a contact material 32. While the use of the contact material 32 is optional, it serves several functions in the completed board, including the prevention of oxidation of the conductive material (preferably copper), the promotion of easier soldering of components to the finished board and the formation of a good ohmic electrical contact between the exterior of the interconnecting pins 22 and the interior of the interconnecting holes 24. Additionally, during construction of the board the contact material 32 also serves as an etch resist as will be described below.

Tin, tin-lead and gold are all suitable materials for the contact material (etch resist) 32.

In the portion of the multi-layer circuit board seen in FIG. 2, the particular recessed circuit lead marked with reference numeral 14a on the upper surface of the first substrate 10, is connected to two other circuit leads 18a, 20a on the upper and lower surfaces of the second substrate 12, respectively.

As previously described, this connection is accomplished by the conductive material which passes from the upper surface of the first substrate 10 down through the component lead hole 26 and around to the exterior of the interconnecting pin 22 which contacts the interior of the interconnecting hole 24.

When tin-lead is employed as the contact material 32, the contact region between the exterior of the interconnecting pin 22 and the interior of the interconnecting hole 24 becomes a fused and soldered joint after heating. However, when gold or tin is employed the pressed-fit contact between the pin 22 and the hole 24 is sufficient to make the necessary electrical connection. It has been found that with injection molded substrates, interconnecting pins having a cylindrical shape are quite suitable for making the necessary connection.

It is believed that the use of the substrate material to form the interconnecting pin, as opposed to making the pin of metal provides a resilience in the pin which promotes good electrical interconnection when the board is assembled. This is particularly important when the interconnecting pins are coated with tin or gold and a press fit is used for maintaining the electrical interconnection.

Referring to FIG. 3, a different embodiment of the invention in an exploded view showing a six-layer circuit board can be seen. In this embodiment, there are three substrates 34, 36 and 38. The first substrate 36 is provided with two opposed interconnnecting pins 40 and 42 on its upper and lower surfaces respectively which contact interconnecting holes 44 and 46 in the second and third substrates 34 and 38. Two layers of pre-preg 48 and 50 are used in this embodiment to bond the three substrates together.

The first substrate 36 is provided with circuit leads 52–60 on both its upper and lower surfaces Circuit leads 54–58 are running out of the drawing perpendicular to the cross-sectional view of FIG. 3, while leads 52 and 60 are running parallel to the cross-section.

The cross-section through leads 54–58 shows more clearly than FIG. 2 that the circuit leads are deposited into circuit lead channels which are recessed into the surface of the substrate. This configuration permits a flat contact surface between the substrates which promotes an improved bond between substrates by the adhesive pre-preg. However, it should be understood that non-recessed circuitry, as is commonly used, can also be employed.

Circuit leads 52 and 60 are connected to each other and to circuit leads 62–68 located on the second and third substrates 34 and 38. The adhesive material or pre-preg 28, 48, 50 must be electrically nonconductive so as to prevent any electrical connection between circuit leads on facing substrate surfaces when the multi-layer board is assembled. For example, adhesive material 48 electrically isolates circuit lead 54 from circuit lead 64 where they cross on opposed faces of the substrates 34 and 36.

In the preferred embodiment, pre-preg 28, 48, 50 is used to bond the substrates together. The pre-preg is provided in sheet form and holes 30, 70, 72 are punched or drilled through it to permit the passage of the interconnecting pins into the interconnecting holes. Liquid or other types of adhesives may be employed provided the adhesive is not applied to the interconnecting pins or holes which would interfere with the electrical connection.

The embodiment seen in FIG. 3 has been shown without a contact coating applied to the surface of the conductive material forming the circuit leads Multi-layer circuit boards with as many layers of circuitry as desired may be constructed by appropriate positioning of the interconnecting pins and holes. Where desired a substrate may carry both interconnecting pins and holes.

THE METHOD OF MAKING THE MULTI-LAYER CIRCUIT BOARD

FIGS. 4 through 8 show the major steps in the construction of the first substrate 10. The construction of the second substrate 12 as well as the substrates 34, 36 and 38 as seen in FIG. 3 is substantially the same.

FIG. 4 is in slightly reduced scale from FIGS. 5–8 and shows a portion of an injection mold containing a corresponding portion of the first substrate 10. The portion of substrate 10 seen within the mold is the same portion of substrate 10 seen in FIG. 2.

The injection mold is formed from two parts, an upper half 74 and a lower half 76, which form an enclosed area defining the shape of the substrate and which may be separated to free the molded substrate.

Using well known injection molding techniques, the substrate material is heated and forced into the enclosed mold to form the first substrate 10. Although injection molding is the preferred method of manufacture of the substrate, other methods may be employed such as plastic stamping, rolling, machining, etc. so as to produce the appropriately shaped substrate.

It should be understood that FIG. 4 shows only a small portion of a much larger mold containing numerous interconnecting pins 22 as would be necessary to form the first substrate 10 seen in FIG. 1. A corresponding mold (not shown) is used to produce the second substrate 12. The mold preferably contains numerous circuit pathway projections, as can been seen indicated by reference numeral 78, which project into the interior of the molds and define the circuit lead channels in the surface of the molded substrates. The particular circuit lead pathway 78 seen in FIG. 4 produces the circuit lead channel which contains circuit lead 14a seen in FIG. 2. The component lead holes 26 are also preferably formed during the injection process by pins 80 which project downwardly from the upper surface 74 of the mold to the lower surface 76.

After molding, the substrate is removed from the mold and an electrically conductive material is applied to defined portions of the surface of the substrate. The preferred method is to cover substantially all of the surface of the substrate with a conductive material. This can be accomplished by electrolessly plating a thin layer of copper or other conductive material over the entire surface of the substrate. FIG. 5 shows a portion of the first substrate 10 as formed in the mold seen in FIG. 4 which has been plated over its entire exposed surface with a thin layer of conductive material 82. It will be noted that the conductive material is plated over all of the exposed surface including the interior of the component lead holes 26.

FIG. 6 shows the next step in the construction of the multi-layer circuit board in which a plating resist 84 has been applied wherever it is desired to prevent the deposit of any additional conductive material.

In a subsequent step, the conductive material located beneath the plating resist 84 will be removed, and accordingly, the only areas not covered by plating resist in FIG. 6 will be those areas where conductive material is ultimately to remain. These areas include the interior of the circuit lead channels 85 as well as the interior of the component lead holes 26, and the exterior of the interconnecting pins 22.

The circuit lead channel 85 seen in FIG. 6 is formed by the circuit lead pathway 78 in the injection mold 74 seen in FIG. 4 and ultimately will contain the finished circuit lead 14a seen in FIGS. 2 and 7.

It is at this point that one major advantage of the use of recessed circuit lead channels can be seen. On the upper surface of substrate 10, the plating resist 84 can be applied by a smooth, cylindrical roller, and because all of the areas where conductive material is to remain have been recessed, the plating resist 84 is easily and quickly applied to the appropriate locations. In the construction of the second substrate 12, which has no interconnecting pins 22, this technique can be applied to both the upper surface and lower surface of substrate 12 as well as to the second and third substrates 34 and 38 as seen in FIG. 3.

With respect to the lower surface of substrate 10, the plating resist must be applied with shaped applicators or by means of conventional optical or other masking techniques.

FIG. 7 shows the next step in the construction of the circuit board. In the preferred method, the substrate 10 is immersed in an electrolytic plating bath and the conductive material is plated onto all exposed portions of the substrate 10. All areas of the substrate masked by the plating resist 84 do not receive any additional conductive material.

In the preferred method, the initial electrolessly plated layer 82 as seen in FIG. 5 is copper, and the subsequently plated electrolytic layer 86 is also copper. Accordingly, for the sake of clarity, FIG. 7 shows only the thick layer of conductive material which remains in the exposed areas identified by reference numeral 86. The copper from the electrolessly plated layer 82 is substantially indistinguishable from the subsequently plated electrolytic layer 86. It should be noted, however, that the first layer 82 may be comprised of a different conductive material than the subsequently plated electrolytic layer 86. It is also possible for the thickness of the layer 82 to be increased by methods other than electrolytic plating, such as electroless plating, and such methods are within the scope of this invention.

Following the deposition of the elctrolytic layer 86, the next step is optional, but preferable, and comprises plating the exposed electrolytic layer 86 with a contact material 88 which serves as an etch resist. The contact material also serves numerous other functions as has been previously described. Following the production of the substrates seen in FIG. 8, the plating resist 84 is removed using a solvent suitable for the plating resist used, and the substrate 10 is immersed in an acid bath which flash-etches away all traces of the electrolessly deposited layer 82 except in those portions where the thickness of the conductive material has been increased electrolytically.

During the step of flash etching, the etch resist 88 serves to protect the electrolytically deposited layer 86 from attack by the etchant. However, when the etch resist 88 is not used, the thickness of the electrolytically deposited layer 86 is sufficiently greater than the thickness of the electrolessly deposited layer 82 that the flash etching step completely removes layer 82 without significantly affecting layer 86. The resulting substrate 10 is substantially as shown in FIG. 2.

Substrate 12 is produced in substantially the same way as described above. The two substrates are then sandwiched together with a layer of adhesive material such as pre-preg between them (with holes punched or drilled into the material to permit the unobstructed passage of the interconnecting pins 22) and the complete multi-layer circuit board is placed in a laminating press under heat and pressure which completes the cure of the semi-cured pre-preg and bonds the substrates together.

An alternate method of manufacturing the multi-layer circuit board may be referred to as the "fully-additive" method wherein the conductive material is applied exclusively by electroless plating.

In this method, the conductive circuit leads (14, 16, 18 and 20 in FIG. 1) and the other defined conductive areas such as the conductive material on the exterior of the interconnecting pins 22 and the interior of the interconnecting holes 24 are deposited electrolessly without additional electrolytic plating. Furthermore, the electrolessly deposited conductive material is applied only to those defined areas where the material is to remain on the completed multi-layer board, thus eliminating the flash-etching step required in the previously decribed method. Electroless deposition in the areas which are to remain nonconductive is prevented by the application of a plating resist as previously described, except that in the fully-additive method the plating resist is applied directly to the surface of the substrates.

Those skilled in the electroless plating art will recognize that the process of electroless plating a conductive material onto a nonconductive substrate typically includes several steps designed to improve the bond between the nonconductive substrate and the electrolessly plated material. Such well-known steps include chemical or mechanical roughening of the surface to be plated, sensitizing or catalytically activating the surface to be plated, and intermediate cleaning and washing steps.

In the method previously described, the step of electroless plating included such standard processing steps. Since the entire substrate surface was electrolessly plated, the step of electroless plating could be viewed as a single step which could be performed using any of the many commercially available processes.

However, with the fully-additive method, only a portion of the substrate surface is electrolessly plated. Accordingly, there are two similar variations of the fully-additive method depending on whether the substrate surface is catalytically activated before or after the plating resist is applied.

Both variations start with the formed substrates (10, 12 in FIG. 1) which are preferably made by injection molding, as previously described, but which may also be manufactured by hot stamping, conventional machining, etc.

The substrate may then be chemically or mechanically roughened to improve the adhesion of the electroless layer.

In the first variation, the entire substrate surface is then catalytically activated. Next, the plating resist is applied to those areas where the conductive material is not to be electrolessly deposited. The plating resist 84 is applied to the same areas and in the same manner (with roller coating, shaped applicators or with conventional imaging techniques) as shown in FIG. 6 to delineate the desired circuit pattern and contact areas. However, in the fully-additive method, the plating resist 84 is applied directly to the activated surface of the substrate 10 rather than to a thin initial electrolessly plated layer (82 in FIG. 6) as in the method previously described.

The conductive material is then electrolessly plated onto the defined portions of the activated surface of substrate 10 wherever the absence of the plating resist 84 leaves that surface exposed. The electroless plating continues until the desired thickness for the conductive material has been built up thereby forming the conductive circuit leads (14, 16, 18 and 20 in FIG. 1) and the conductive contact areas on the exterior of the interconnecting pins 22 and the interior of the interconnecting hole 24.

A contact material 88 may optionally be electrolessly plated onto the conductive material. The plating resist 84 is then removed with an appropriate solvent as previously described.

The second substrate 12 may then be produced using the same method and the completed board is assembled with the pre-preg 28 as previously described.

The second variation of the fully-additive method is to apply the plating resist 84 to the substrate prior to catalytically activating the surface. With the selection of an appropriate plating resist 84, the subsequent step of catalytic activation occurs essentially only on the exposed surface of the substrate. The substrate is then electrolessly plated to apply the conductive material to the defined portions of the surface of the substrates. The plating resist is then removed and the substrates assembled to complete the multi-layer board as previously described.

What I claim is:

1. A method of forming a multi-layer circuit board comprising the steps of:

providing a first enclosed injection mold adapted to form a first circuit board substrate having interconnecting pins projecting out of the surface of the first substrate;

providing a second enclosed injection mold adapted to form a second circuit board substrate shaped to mate with the first substrate and having interconnecting holes in the second substrate to receive the interconnecting pins on the first substrate;

fabricating the first and second circuit board substrates by injecting an electrically nonconductive substrate material into the first and second injection molds;

removing the first and second substrates from the injection molds;

applying an electrically conductive material onto defined portions of the surface of the first and second substrates to form circuit leads, onto the exterior of the interconnecting pins on the first substrate and into the interior of the interconnecting holes in the second substrate;

providing an electrically nonconductive adhesive material; and assembling the multi-layer circuit board by placing the adhesive material between the first and second substrates and mating the interconnecting pins and holes, the electrically nonconductive adhesive material being positioned to insulate the circuit leads on the facing surfaces of the substrates and permitting electrical connection between selected circuit leads at the point of contact between the exterior of the interconnecting pins and the interior of the interconnecting holes.

2. The method of forming a multi-layer circuit board of claim 1 wherein the step of applying an electrically conductive material onto defined portions of the surface of the first and second substrates to form circuit leads, onto the exterior of the interconnecting pins on the first substrate and into the interior of the interconnecting holes in the second substrate includes the steps of:

plating substantially all of the surface of the first and second substrates with a first electrically conductive material;

masking the substrates with a plating resist to cover those areas where the conductive material is to be removed;

plating the substrates in the areas not masked to plating resist with a second electrically conductive material;

removing the plating resist; and flash-etching the substrates to remove the layer of first electrically conductive material from the areas previously covered by the plating resist.

3. The method of forming a multi-layer circuit board of claim 2 wherein the first electrically conductive material is plated electrolessly and the second electrically conductive material is plated electrolytically.

4. The method of forming a multi-layer circuit board of claim 2 wherein the first and second electrically conductive materials are both copper.

5. The method of forming a multi-layer circuit board of claim 2 wherein the layer of second electrically conductive material is subsequently plated with a contact material.

6. The method of forming a multi-layer circuit board of claim 5 wherein the contact material is tin.

7. The method of forming a multi-layer circuit board of claim 1 wherein the first injection mold is shaped so as to form component lead holes extending axially through the interconnecting pins.

8. The method of forming a multi-layer circuit board of claim 1, wherein the electrically nonconductive adhesive material comprises a sheet of pre-preg with holes provided therein to match the position of the interconnecting pins.

9. The method of forming a multi-layer circuit board of claim 8 wherein the step of assembling the multi-layer circuit board is followed by the step of applying heat and pressure to activate the adhesive of the pre-preg and bond the substrates together.

10. The method of forming a multi-layer circuit board of claim 1 wherein at least one of the injection molds is shaped to produce circuit lead channels recessed into a surface of the substrate formed therein.

11. The method of forming a multi-layer circuit board of claim 10 wherein the step of applying an electrically conductive material onto defined portions of the surface of the first and second substrates to form circuit leads and to the exterior of the interconnecting pins on the first substrate and into the interior of the interconnecting holes in the second substrate includes the steps of:

plating substantially all of the surface of the substrates with a first electrically conductive material;

applying a plating resist by means of a roller to at least one surface of at least one substrate to mask the non-recessed portions of said surface;

plating said at least one surface again to increase the thickness of the conductive material in the recessed circuit lead channels;

removing the plating resist; and flash-etching said at least one surface to remove the electrolessly deposited layer of conductive material from those areas previously covered by the plating resist.

12. A multi-layer circuit board comprising:

a first circuit board substrate constructed of an electrically nonconductive substrate material, said first substrate having an upper and lower surface with interconnecting pins projecting out of the lower surface of the first substrate, said interconnecting pins having component lead holes passing axially through the interconnecting pins, the interconnecting pins being formed as integral extensions of the material of the first circuit board substrate;

a second circuit board substrate constructed of an electrically nonconductive substrate material and shaped to mate with the lower surface of the first substrate, said second substrate having an upper and lower surface with interconnecting holes passing from the upper surface through the second substrate to the lower surface to receive the interconnecting pins on the first substrate;

an electrically conductive material applied to defined areas of the upper and lower surfaces of the first and second substrates; said defined areas including circuit leads, the exterior of the interconnecting pins, the interior of the interconnecting holes and the interior of component lead holes; and a layer of electrically nonconductive adhesive material positioned between the first and second substrates so as to bond the first substrate to the second substrate, the interconnecting pins passing through the adhesive material into the interconnecting holes whereby electrical connection is made between the conductive material on the exterior of the interconnecting pins and the conductive material on the interior of the interconnecting holes.

13. The multi-layer circuit board of claim 12 wherein the circuit board substrates are formed by injection molding.

14. The multi-layer circuit board of claim 12 wherein the circuit lead paths are recessed into the surface of the first and second substrates.

15. The multi-layer circuit board of claim 12 wherein the electrically conductive material is plated with a contact material.

16. The multi-layer circuit board of claim 12 wherein the first circuit board substrate includes interconnecting pins projecting out of the upper surface of the first substrate and wherein the multi-layer circuit board further comprises;

a third circuit board substrate having interconnecting holes therein and is shaped to mate with the upper surface of the first substrate; and a second layer of electrically nonconductive adhesive material positioned between the first and third substrates so as to bond the first substrate to the third substrate, the interconnecting pins on the upper surface of the first substrate passing through the second layer of adhesive material into the interconnecting holes in the third substrate.

17. The multi-layer circuit board of claim 12 wherein the substrates include circuit lead channels recessed into the surface of the substrates, the conductive material being applied into the circuit lead channels to form the circuit leads.

18. The method of forming a multi-layer circuit board of claim 1 wherein the step of applying an electrically conductive material onto defined portions of the surface of the first and second substrates to form circuit leads, onto the exterior of the interconnecting pins on the first substrate and into the interior of the interconnecting holes in the second substrate includes the steps of:

masking the substrates with a plating resist outside the defined portions to cover those areas where the conductive material is not to be applied;

electrolessly plating the defined portions of the substrates with the conductive material; and removing the plating resist.

19. The method of claim 18 wherein the step of masking the substrates with a plating resist is preceded by a step of catalytically activating the surface of the substrates.

20. The method of claim 18 wherein the step of masking the substrates with a plating resist is followed by a step of catalytically activating the surface of the substrates.

21. The method of claim 18 wherein the conductive material is subsequently plated with a contact material.

* * * * *